US008655423B2

(12) United States Patent
Miyazaki et al.

(10) Patent No.: US 8,655,423 B2
(45) Date of Patent: Feb. 18, 2014

(54) SUPERCONDUCTING COIL

(75) Inventors: Hiroshi Miyazaki, Yokohama (JP); Sadanori Iwai, Kawasaki (JP); Kei Koyanagi, Yokohama (JP); Taizo Tosaka, Yokohama (JP); Kenji Tasaki, Tokyo (JP); Masami Urata, Yokohama (JP); Shigeru Ioka, Yokohama (JP); Yusuke Ishii, Yokohama (JP); Michitaka Ono, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 13/295,788

(22) Filed: Nov. 14, 2011

(65) Prior Publication Data

US 2012/0122697 A1 May 17, 2012

(30) Foreign Application Priority Data

Nov. 15, 2010 (JP) ................................ P2010-255145

(51) Int. Cl.
*H01B 12/00* (2006.01)
*H01F 6/00* (2006.01)
*H01L 39/00* (2006.01)

(52) U.S. Cl.
USPC ........................................................ 505/211

(58) Field of Classification Search
USPC .......................................... 505/211, 162, 879
See application file for complete search history.

(56) References Cited

FOREIGN PATENT DOCUMENTS

| | | | |
|---|---|---|---|
| GB | 1 262 902 | | 2/1972 |
| JP | 58-2012 | | 1/1983 |
| JP | 63-196016 | A | 8/1988 |
| JP | 3-135004 | A | 6/1991 |
| JP | 2000-133515 | | 5/2000 |
| JP | 2001-267119 | A | 9/2001 |
| JP | 2008-140905 | | 6/2008 |
| JP | 2008-243588 | A | 10/2008 |
| JP | 2010123621 | * | 6/2010 |
| JP | 2010267835 | * | 10/2010 |

OTHER PUBLICATIONS

Translation of JP 2010267835.*
Translations of JP 2010123621.*
Office Action issued on Mar. 4, 2013, in Korean Patent Application No. 10-2011-0117392.
Combined Search and Examination Report under Sections 17 and 18(3) issued Mar. 7, 2012, in United Kingdom Patent Application No. GB 1119478.4.
German Office Action issued Sep. 6, 2013, in German Patent Application No. 10 2011 118 465.5 (with English translation).

* cited by examiner

*Primary Examiner* — Colleen Dunn
(74) *Attorney, Agent, or Firm* — Oblon, Spivak, McClelland, Maier & Neustadt, L.L.P.

(57) ABSTRACT

A superconducting coil is provided with a superconducting coil portion having a plurality of concentric coil layer portions. The superconducting coil portion is formed by winding a thin-film superconducting wire and an insulating material with a multilayer structure, wherein the concentric coil layer portions are adjacent to each other at boundary portions having adhesive force that are set to be less than that of other portions. The concentric coil layer portions each has a non-circular shape or circular shape.

14 Claims, 13 Drawing Sheets

SUPERCONDUCTING COIL

BACKGROUND OF THE INVENTION

1. Field of the Invention

The present invention relates to a superconducting coil, and more particularly, to a concentric superconducting coil of a thin-film superconducting wire wound with a multilayer structure around a core into concentric shape so as to reduce a peel force in the superconducting coil with higher stability.

Each of the concentric superconducting coil has a non-circular shape including a racetrack shape, a saddle shape, an ellipse shape, an oval shape and a rectangle shape, and also has a circular shape.

2. Description of the Related Art

According to the progressing and advancing of superconducting technology, systems or apparatus for, for example, magnetic resonance imaging (MRI) diagnosis, superconducting magnetic energy storage (SMES), and crystal pulling have been practically used. In these systems or apparatus, superconducting tape wires of laminated members are wound into superconducting coils for an actual use, and generally, impregnated coils formed by resin impregnation are used in view of cooling and handling ease.

In an impregnated coil, however, a force is applied perpendicularly (in a peeling direction) to a longitudinal direction of a superconducting tape wire during cooling due to anisotropy of a coefficient of linear expansion of members.

Superconducting tape wires exhibit excellent mechanical properties, for instance, stress resistance, against a longitudinal force but are susceptible to a force applied in a peeling direction. Thus, impregnated coils of superconducting tape wires may unfortunately degrade superconducting characteristics during a cooling operation.

For this reason, in order to prevent distortion caused by a difference in coefficient of linear expansion between a core and a superconducting tape wire, there has been provided a method of winding wires without bonding an outer periphery of the core to an innermost turn of a coil such as disclosed in Japanese Patent Laid-Open Publication No. 2008-140905 (Patent Document 1).

Furthermore, in accordance with the tendency of the superconducting coil being larger, the diameter ratio (i.e., outside diameter/inside diameter) becomes also larger. Hence, a peel force generated in the coil increases. In the case where the peel force exceeds an allowable stress of a superconducting tape wire, superconducting characteristics may degrade.

SUMMARY OF THE INVENTION

The present invention was conceived in consideration of the above circumstances and an object thereof is to provide a superconducting coil having an improved stability thereof by reducing a peel force generated in the superconducting coil to thereby prevent degradation of superconducting characteristics of the superconducting coil.

The above and other objects of the present invention can be achieved by providing a superconducting coil comprising a superconducting coil portion having a plurality of concentric coil layer portions, the superconducting coil portion being formed by winding a thin-film superconducting wire and an insulating material with a multilayer structure, wherein the concentric coil layer portions are adjacent to each other at boundary portions having adhesive force that are set to be less than that of other portions.

Each of the concentric superconducting coil portions has a non-circular shape or a circular shape.

According to the present invention, a peel force generated in the superconducting coil can be reduced. Thus, degradation of superconducting characteristics of the superconducting coil can be prevented and stability of the superconducting coil can be improved.

The nature and further characteristic features of the present invention will be made clearer from the following description of preferred embodiments with reference to the accompanying drawings.

BRIEF DESCRIPTION OF THE DRAWINGS

In the accompanying drawings:

FIG. 6 illustrates a superconducting coil having non-circular shape according to a first embodiment of the present invention, in which

FIG. 10 illustrates a superconducting coil having non-circular shape according to a fourth embodiment of the present invention, in which

FIG. 11 illustrates a superconducting coil having non-circular shape according to a fifth embodiment of the present invention, in which

FIG. 14 including FIG. 15 illustrates a superconducting coil having circular shape according to further embodiment of the present invention, corresponding to FIG. 6, in which

DESCRIPTION OF THE PREFERRED EMBODIMENTS

Hereunder, embodiments of the present invention will be described with reference to the accompanying drawings.

(Superconducting Tape Wire)

Figure 1:
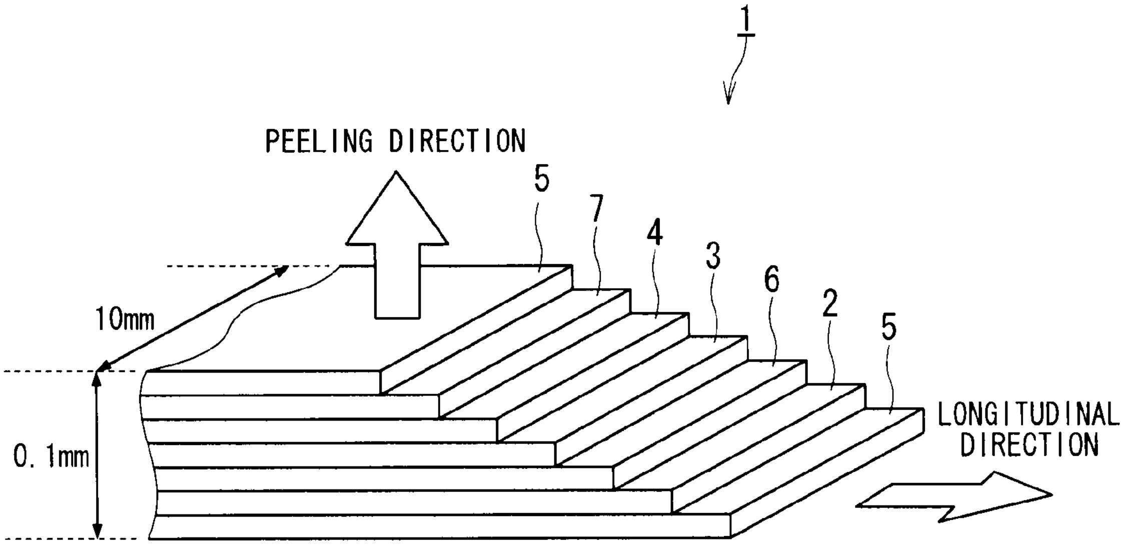
FIG. 1 is an illustration of a structural diagram showing an example of a superconducting tape wire used for a superconducting coil according to an embodiment of the present invention.

FIG. 1 is a structural diagram illustrating an example of a superconducting tape wire used for a superconducting coil according to an embodiment of the present invention.

A superconducting tape wire 1 includes a thin-film superconducting wire made of oxide superconducting compound materials. The superconducting tape wire 1 includes at least a tape substrate 2, an intermediate layer 3, and a superconducting layer 4. Both surfaces of the superconducting tape wire 1 are covered with stabilizing layers 5.

Furthermore, an orientation (oriented) layer 6 may be optionally provided between the tape substrate 2 and the intermediate layer 3 and a protective layer 7 may be optionally provided between the superconducting layer 4 and the stabilizing layer 5. The orientation layer 6 is used for orienting the non-orientation (non-oriented) tape substrate 2 made of materials such as stainless steel and hastelloy.

For example, the tape substrate 2 is made of materials including stainless steel, a nickel alloy such as hastelloy, and a silver alloy.

The intermediate layer 3 is a diffusion preventing layer formed on the tape substrate 2. For example, the intermediate layer 3 is made of a material such as cerium oxide, YSZ, magnesium oxide, yttrium oxide, ytterbium oxide, barium, and zirconia.

The superconducting layer 4 includes, for example, a superconducting thin film containing RE-based composition REBCO (such as RE1B2C3O7). "RE" in "RE1B2C3O7" represents at least one of rare-earth elements (e.g., neodymium (Nd), gadolinium (Gd), holmium (Ho), and samarium (Sm)) and yttrium elements, "B" represents barium (Ba), "C" represents copper (Cu), and "O" represents oxygen (O).

The stabilizing layer 5 is provided to prevent burning of the superconducting layer 4 in the event of excessive electricity to the superconducting layer 4. The stabilizing layer 5 is made of a conductive material such as silver or gold.

The orientation layer 6 is provided to orient the intermediate layer 3 on the tape substrate 2 and is made of a material such as magnesium oxide (MgO). The orientation layer 6 may be omitted in a case where an oriented substrate is used.

The protective layer 7 is provided to prevent the superconducting layer 4 from being degraded by moisture in air. The protective layer 7 is made of silver, gold and platinum. The protective layer 7 also prevents the superconducting layer 4 from being damaged by burning in the event of excessive electricity to the superconducting layer 4.

The multilayer superconducting tape wire 1 of the structure mentioned above is, for example, 10 mm in width and 0.1 mm in thickness. The superconducting tape wire 1 is used for several kinds of superconducting technology, for example, an MRI apparatus, a superconducting magnetic energy storage (SMES) apparatus, a crystal pulling apparatus, and a linear motor. The superconducting tape wire 1 having a width of 2 mm to 40 mm and a thickness of 0.4 mm to 0.5 mm is usable.

It is further known that the superconducting tape wire 1 has a high mechanical strength (i.e., stress resistance) in a longitudinal direction of the wire without degrading a heat conduction property relative to a tensile force of the order of 600 MPa, but in a peeling direction perpendicular to the longitudinal direction, the superconducting tape wire 1 only has a mechanical strength of one digit or less relative to the mechanical strength in the longitudinal direction.

Figure 2:
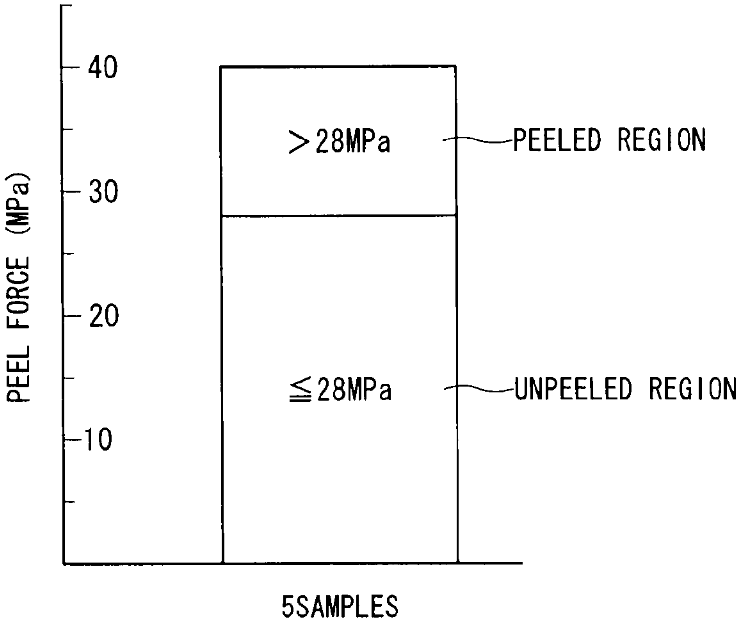
FIG. 2 is a bar chart showing an allowable peel force of the superconducting tape wire illustrated in FIG. 1.

FIG. 2 shows measurement results on transverse tensile strengths in the peeling direction, for five samples of the superconducting tape wire 1 illustrated in FIG. 1.

According to the results of FIG. 2, the superconducting tape wire 1 may be degraded by at least a peel force exceeding 28 MPa, though a stress for peeling off the superconducting tape wire 1 ranges from 28 MPa to 40 MPa. Hence, it is understood that an allowable peel force of the superconducting tape wire 1 is 28 MPa.

A current-carrying capacity of a superconducting wire is called a critical current. A superconducting state of the super conducting tape wire 1 can only be held and kept at values or levels less (not more) than predetermined temperature, magnetic field, and current value.

The critical current is a maximum current value for holding the superconducting state. In a case where a peel force generated in a coil of the superconducting tape wire 1 exceeds an allowable stress of the superconducting tape wire, the superconducting state of a superconducting coil 12 cannot be held, and the superconducting tape wire 1 cannot be kept in the superconducting state.

In the case where the superconducting state of the superconducting coil 12 cannot be held, the superconducting characteristics are degraded, leading to heating and burning of the superconducting coil 12. Thus, thermal stability of the superconducting coil 12 will be lost.

However, in the case where the superconducting tape wire 1 is kept at a stress of the allowable peel force (28 MPa) or lower, the superconducting state of the superconducting coil 12 is not lost and the superconducting tape wire 1 can be kept in the superconducting state.

(Superconducting Coil)

Figure 3:
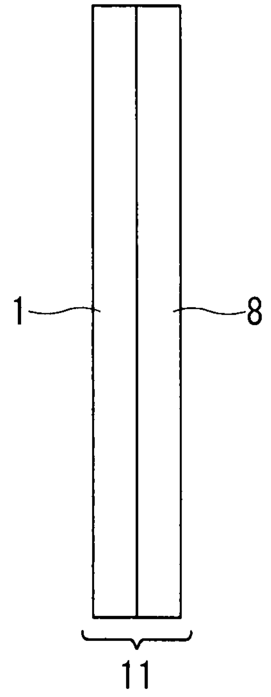
FIG. 3 is a schematic diagram illustrating a composite tape used for the superconducting coil according to the embodiment of the present invention.

As illustrated in FIG. 3, the superconducting tape wire 1 on an insulating tape 8 coated with resin is laminated into a composite tape 11. The composite tape 11 is wound like a spiral around an FRP core 9 to form a superconducting coil 12 shaped like a racetrack as shown in FIG. 4.

The integrally hardened superconducting coil 12 suppresses a mechanical movement of the thin-film superconducting wire during the use of the superconducting coil, keeps a strength of the coil, provides insulation protection between the thin-film superconducting wires, and effectively prevents "quench" that is an interrupted superconducting state of the superconducting coil.

However, when the superconducting coil 12 is cooled from room temperature to a liquid nitrogen temperature, a peel force is generated on the superconducting tape wire 1 due to anisotropy of a coefficient of linear expansion of components in the superconducting tape wire 1. This peel force depends upon a diameter ratio (i.e., outside diameter/inside diameter) of the superconducting coil 12.

Figure 4:
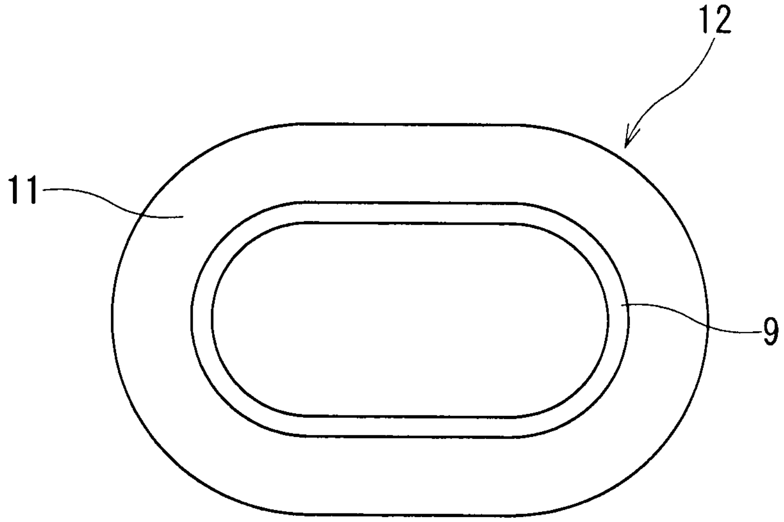
FIG. 4 is a schematic diagram illustrating the superconducting coil manufactured by using the composite tape.

In this example, the superconducting coil 12 of FIG. 4 is shaped like a racetrack. The superconducting coil 12 may have any shapes including non-circular shape, for example, an ellipse, an oval, a saddle, a rectangle, and a polygon (pentagon, hexagon), and also including a circular shape.

Figure 5:
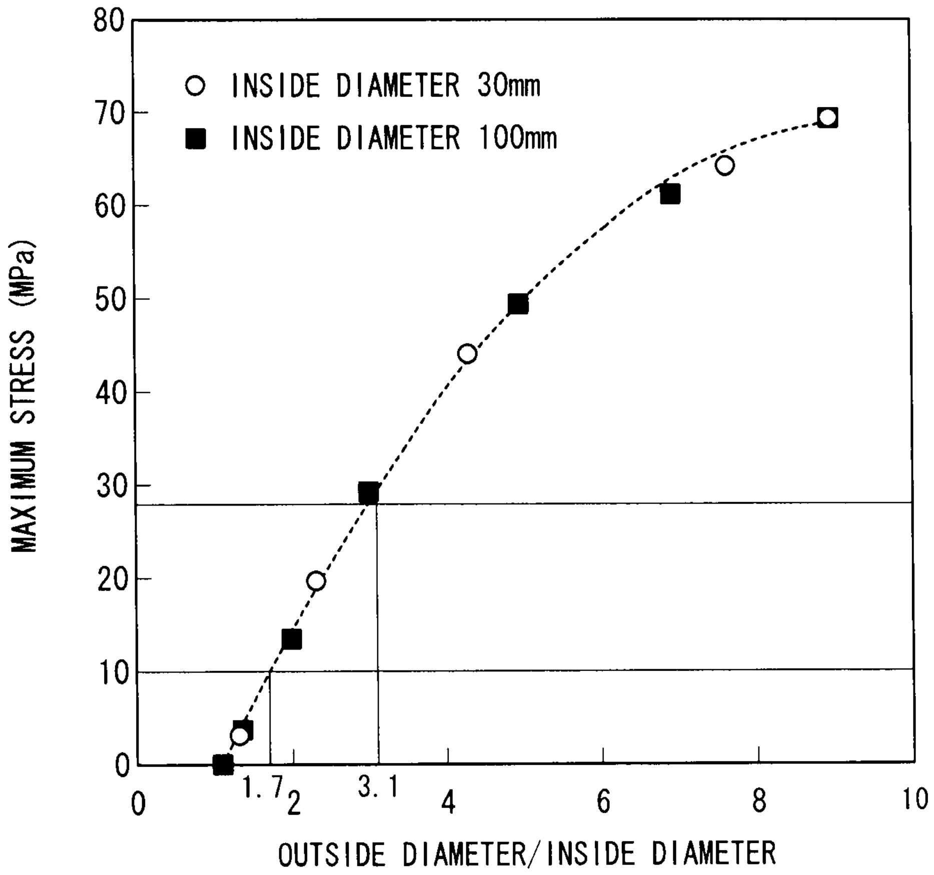
FIG. 5 is a graph showing relationship between a maximum stress (peel force) generated in the superconducting coil and a diameter ratio (i.e., outside diameter/inside diameter)

FIG. 5 shows a graph representing a relationship between a maximum stress generated in the superconducting coil 12 and a ratio of an outside diameter to an inside diameter.

According to the result of FIG. 5, as the diameter ratio of the superconducting coil 12 increases, the maximum stress also increases.

Furthermore, it is found that the superconducting coil 12 has a diameter ratio of 3.1 at 28 MPa that is an allowable peel force of the superconducting tape wire 1.

Embodiments of the superconducting coil using the superconducting tape wire 1 of the structure mentioned above will be described hereunder.

Further, it is to be noted that although in the following embodiments shown in FIGS. 6 to 13 represent a superconducting coil including a plurality of superconducting coil layer portions particularly having a racetrack shape (non-circular-shape), the present embodiment may includes other non-circular shapes such as shown in FIG. 14, as well as circular shape shown in FIG. 15.

First Embodiment

Figure 6A:
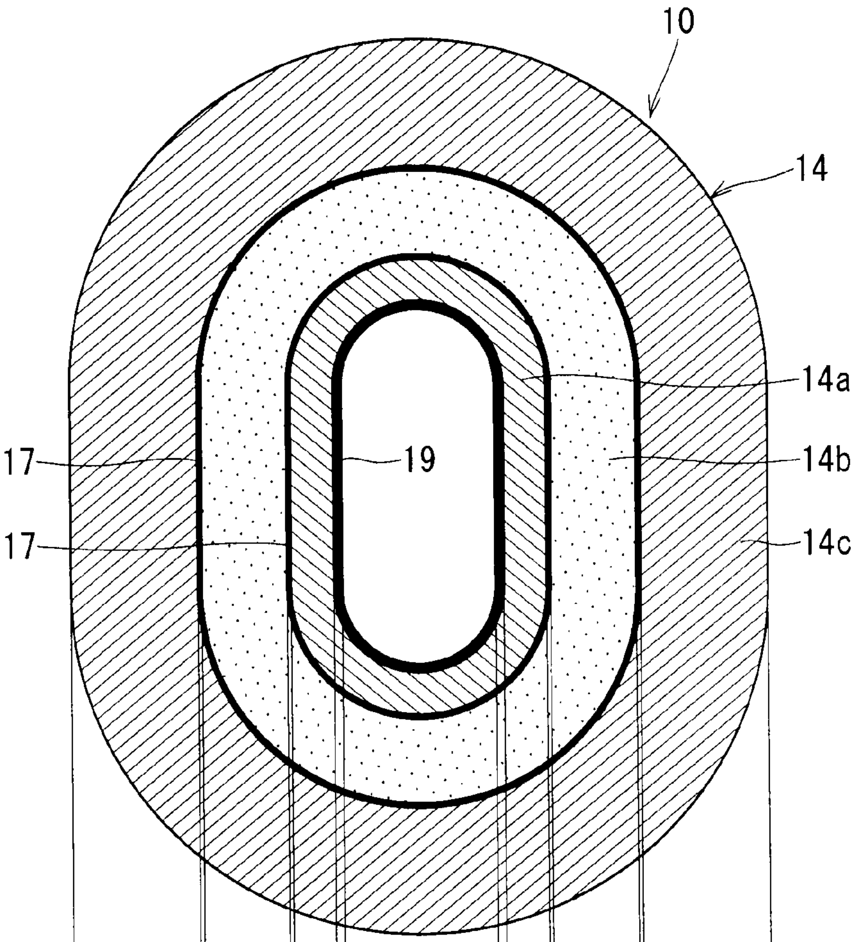
FIG. 6A is a plan view and FIG. 6B is a sectional view thereof.
Figure 6B:
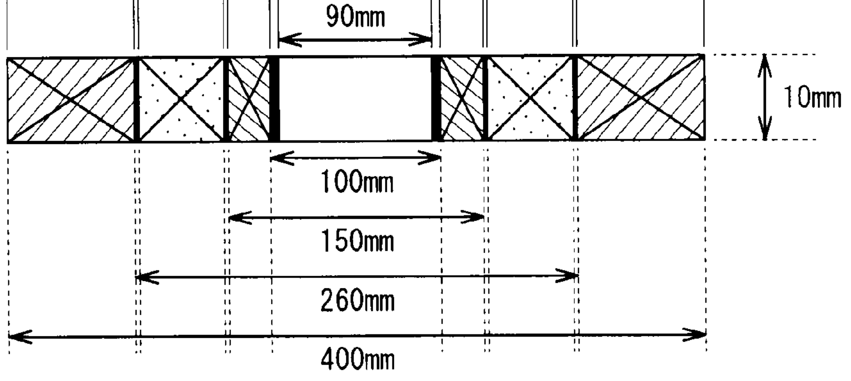

A superconducting coil according to a first embodiment of the present invention will be described below with reference to FIG. 6 (FIGS. 6A and 6B).

With reference to FIG. 6, a superconducting coil 10 is formed by, for example, providing a superconducting coil portion 14 on an outer surface of an FRP core 19. The superconducting coil portion 14, having a non-circular, but concentric, shape such as racetrack, has an outside (outermost) diameter of 400 mm and an inside (innermost) diameter of 100 mm. The FRP core 19 is 100 mm in outside diameter and 90 mm in inside diameter and includes a linear portion having a length of 150 mm. FIGS. 6A and 6B illustrate an example a case of an oval shape with width dimensions of the superconducting coil 10. In the case of an oval shape, length dimensions may be compared with each other.

The superconducting coil portion 14 includes non-circular but concentric three coil layer portions (regions) that are coplanar with one another or provided in the form of a flat plate. The three coil layer portions are a coil inner layer portion (inner layer region, first layer region) 14*a* having an outside diameter of 150 mm and an inside diameter of 100 mm, a coil intermediate layer portion (intermediate layer region, second layer region) 14*b* having an outside diameter of 250 mm and an inside diameter of 150 mm, and a coil outer layer portion (outer layer region, third layer region) 14*c* having an outside diameter of 400 mm and an inside diameter of 250 mm.

The coil inner layer portion 14*a*, the coil intermediate layer portion 14*b*, and the coil outer layer portion 14*c* of the superconducting coil portion 14 are substantially identical in shape in the superconducting coil 10.

Moreover, release portions 17 are provided between the coil inner layer portion 14*a* and the coil intermediate layer portion 14*b* (as boundary portion 17) and between the coil intermediate layer portion 14*b* and the coil outer layer portion 14*c* (as boundary portion 17). The release portions 17 are previously set to be non-adhesive or less adhesive than other portions.

The superconducting coil 10 is formed by winding 750 turns of a composite tape 11 around the FRP core 19 having an inside diameter of 90 mm and an outside diameter of 100 mm.

The composite tape 11 is a laminate of a superconducting tape wire 1 that is a thin-film superconducting wire having a width of 10 mm and a thickness of 0.1 mm and an insulating tape 8 that is an insulating material having a width of 10 mm and a thickness of 0.1 mm. In this example, although the number of turns of the composite tape 11 sequentially increases from the coil inner layer portion 14*a* to the outside, the number of turns is not particularly limited to this example.

In the case of the superconducting coil 10 formed by winding 750 turns of the composite tape 11, the release portions 17 are formed by applying a release agent to an outer surface of the composite tape 11 at a 125th turn, an inner surface of the composite tape 11 at a 126th turn, the outer surface of the composite tape 11 at a 375th turn, and the inner surface of the composite tape 11 at a 376th turn. As the release agent 17, a fluorocarbon polymer, paraffin, grease, and silicon oil may be adopted.

The formation of the release portions (boundary portions) 17 may lead in a result in which, on the composite tape 11 at the 125th turn, the 126th turn, the 375th turn, and the 376th turn of the superconducting coil portion 14, the superconducting coil 10 is non-adhesive or less adhesive than other portions between the adjacent superconducting tape wire 1 and insulating tape 8.

Hence, the superconducting coil portion 14 of the superconducting coil 10 is divided into three identical coil layer portions that are the coil inner layer portion 14*a*, the coil intermediate layer portion 14*b*, and the coil outer layer portion 14*c*. The diameter ratios of the coil layer portions are 150/100=1.5, 250/150=1.7, and 400/250=1.6, respectively. The coil layer portions of the superconducting coil portion 14 have diameter ratios of 1.5, 1.7, and 1.6, so that a maximum stress is 10 MPa or less as shown in FIG. 5, leading to a smaller peel force.

Therefore, in the superconducting coil 10 of the present embodiment, the diameter ratios of the coil layer portions can be less than 3.1. Thus, as shown in a graph of FIG. 5, even in the case where a peel force is generated in the superconducting coil 10, releasing by the release portions 17 can suppress a peel force on the superconducting tape wire 1 to less than an allowable value of 28 MPa. In the case where the diameter ratios of the coil layer portions of the superconducting coil 10 are 1.7 or less, the maximum stress can be 10 MPa. In the case where the diameter ratios are 1.5 or less, the maximum stress can be about 5 MPa or less. Hence, by setting the diameter ratios of the coil layer portions of the superconducting coil 10 at about 1, for example, 1.2 or 1.3, the maximum stress can be further reduced.

Therefore, it is possible to prevent degradation of superconducting characteristics of the superconducting coil 10 and to improve the stability of the superconducting coil.

Second Embodiment

Hereunder, a superconducting coil according to a second embodiment of the present invention will be described with reference to FIG. 7, in which the same configurations (portions or elements) as in the first embodiment are indicated by the same reference numerals and the explanation thereof is omitted.

Figure 7:
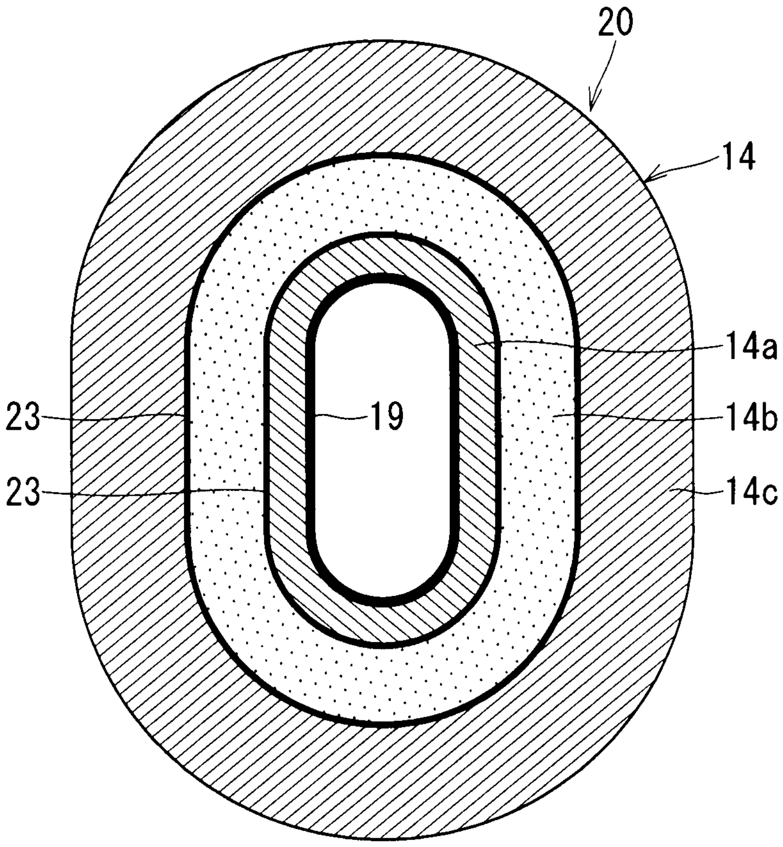
FIG. 7 is a schematic diagram illustrating a plan view of a superconducting coil having non-circular shape according to a second embodiment of the present invention.

In this example of FIG. 7, a superconducting coil 20 of the second embodiment is formed by winding 750 turns of a composite tape 11 as in the superconducting coil 10 of FIGS. 6A and 6B. The superconducting coil 20 of FIG. 7 is identical to the superconducting coil 10 of the first embodiment in FIG. 6 except that FRP tapes 23 are inserted between an outer surface of the composite tape 11 at a 125th turn of a superconducting coil portion 14 and am inner surface of the composite tape 11 at a 126th turn and between the outer surface of the composite tape 11 at a 375th turn and the inner surface of the composite tape 11 at a 376th turn.

The insertion of the FRP tapes 23 causes a superconducting tape wire 1 and an insulating tape 8 adjacent to the superconducting tape wire 1 to be non-adhesive (non-contact) to each other between the composite tapes 11 at the 125th turn and the 126th turn and the composite tapes 11 at the 375th turn and the 376th turn.

Hence, the superconducting coil portion 14 of the superconducting coil 20 is divided into three identical coil layer portions including a coil inner layer portion (inner layer region, first layer region) 14*a*, a coil intermediate layer portion (intermediate layer region, second layer region) 14*b*, and a coil outer layer portion (outer layer region, third layer region) 14*c*. The diameter ratios of the coil layer portions are 150/100=1.5, 250/150=1.7, and 400/250=1.6, respectively.

The coil layer portions of the superconducting coil 20 have diameter ratios of 1.5, 1.7, and 1.6, so that a maximum stress can be 10 MPa or less.

Accordingly, in the superconducting coil 20 of the second embodiment, since the diameter ratios of the coil layer portions can be less than 3.1, as shown in a graph of FIG. 5, a peel force generated on the superconducting tape wire 1 can be suppressed to less than an allowable value of 28 MPa.

Therefore, it is possible to prevent degradation of superconducting characteristics of the superconducting coil 20 and to improve the stability thereof.

Third Embodiment

Figure 8:
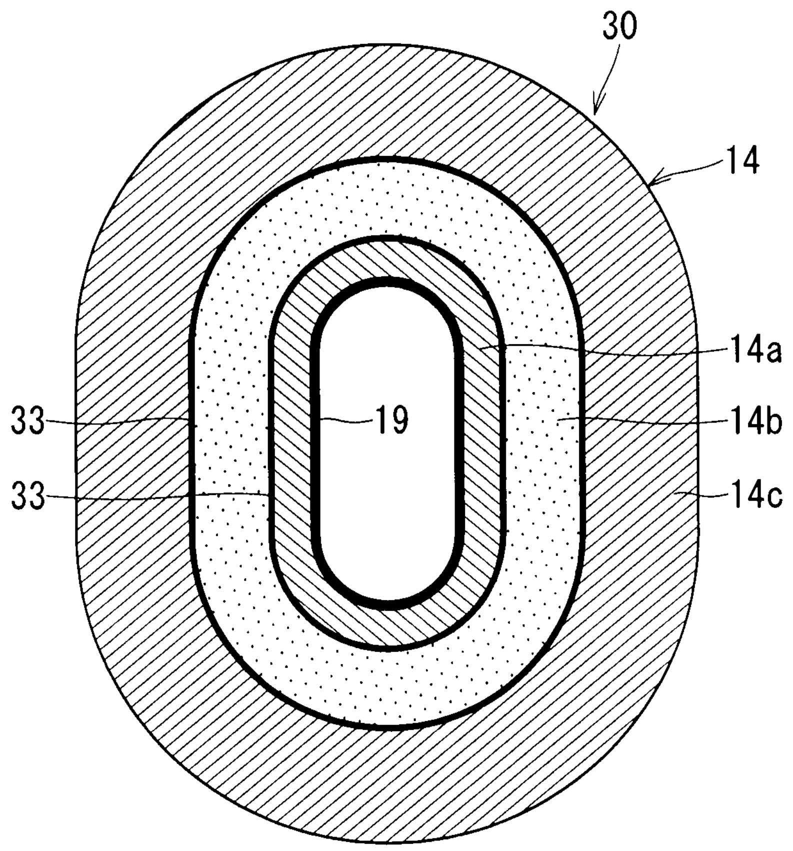
FIG. 8 is a schematic diagram illustrating a plan view of a superconducting coil having non-circular shape according to a third embodiment of the present invention.

A superconducting coil according to a third embodiment of the present invention will be described hereunder with reference to FIG. 8, in which the same configurations as in the first and second embodiments are indicated by the same reference numerals and the explanation thereof is omitted.

In this example, a superconducting coil 30 of the third embodiment is formed by winding 750 turns of a composite tape 11 as in the superconducting coil 10 of FIG. 6. The superconducting coil 30 of FIG. 8 is identical to the superconducting coil 10 of the first embodiment except that cooling/insulating tapes 33 are inserted between an outer surface of the composite tape 11 at a 125th turn of a superconducting coil portion 14 and an inner surface of the composite tape 11 at a 126th turn and between the outer surface of the composite tape 11 at a 375th turn and the inner surface of the composite tape 11 at a 376th turn.

Figure 9:
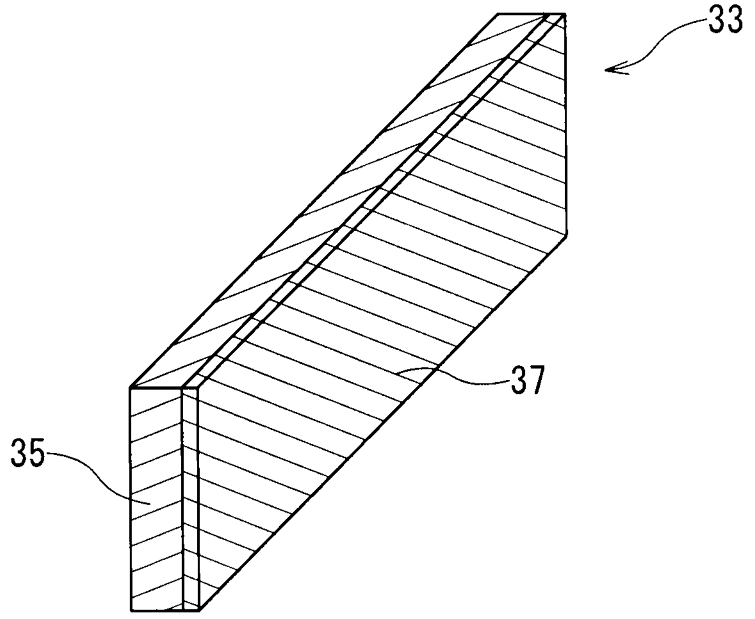
FIG. 9 is an enlarged perspective view of a cooling/insulating tape used for the superconducting coil according to the third embodiment of the present invention.

As shown in FIG. 9, the cooling/insulating tape 33 is formed by attaching an insulating tape 37 to a cooling plate 35 made of material having high heat conductivity, for example, aluminum or copper. The cooling/insulating tape 33 may be a single tape of aluminum nitride having excellent cooling/insulating function, instead of a combination of the cooling plate 35 and the insulating tape 37.

The insertion of the cooling/insulating tape 33 in the superconducting coil 30 causes a superconducting tape wire 1 and an insulating tape 8 adjacent to the superconducting tape wire 1 to be non-adhesive (non-contact) to each other between the composite tapes 11 at the 125th turn and the 126th turn of the superconducting coil portion 14 and the composite tapes 11 at the 375th turn and the 376th turn.

Hence, the superconducting coil portion 14 of the superconducting coil 30 is divided into three identical coil layer portions including a coil inner layer portion (inner layer region, first layer region) 14*a*, a coil intermediate layer portion (intermediate layer region, second layer region) 14*b*, and a coil outer layer portion (outer layer region, third layer region) 14*c*. The diameter ratios of the coil layer portions are 150/100=1.5, 250/150=1.7, and 400/250=1.6, respectively. The coil layer portions of the superconducting coil 30 have diameter ratios of 1.5, 1.7, and 1.6, so that a maximum stress can be 10 MPa or less.

In the superconducting coil 30 of the third embodiment, since the diameter ratios of the coil layer portions can be less than 3.1, as shown in a graph of FIG. 5, a peel force generated on the superconducting tape wire 1 can be suppressed to less than an allowable value of 28 MPa.

Therefore, it is possible to prevent degradation of superconducting characteristics of the superconducting coil 30 and to improve the stability thereof.

Furthermore, in the present embodiment, the cooling/insulating tapes 33 are inserted into the superconducting coil 30, so that the superconducting coil 30 can be cooled from the inside and outside. Thus, the superconducting coil 30 can be efficiently cooled and to improve the stability thereof.

Fourth Embodiment

A superconducting coil according to a fourth embodiment of the present invention will be described hereunder with reference to FIG. 10 (FIGS. 10A and 10B), in which the same configurations as in the first to third embodiments are indicated by the same reference numerals and the explanation thereof is omitted.

Figure 10A:
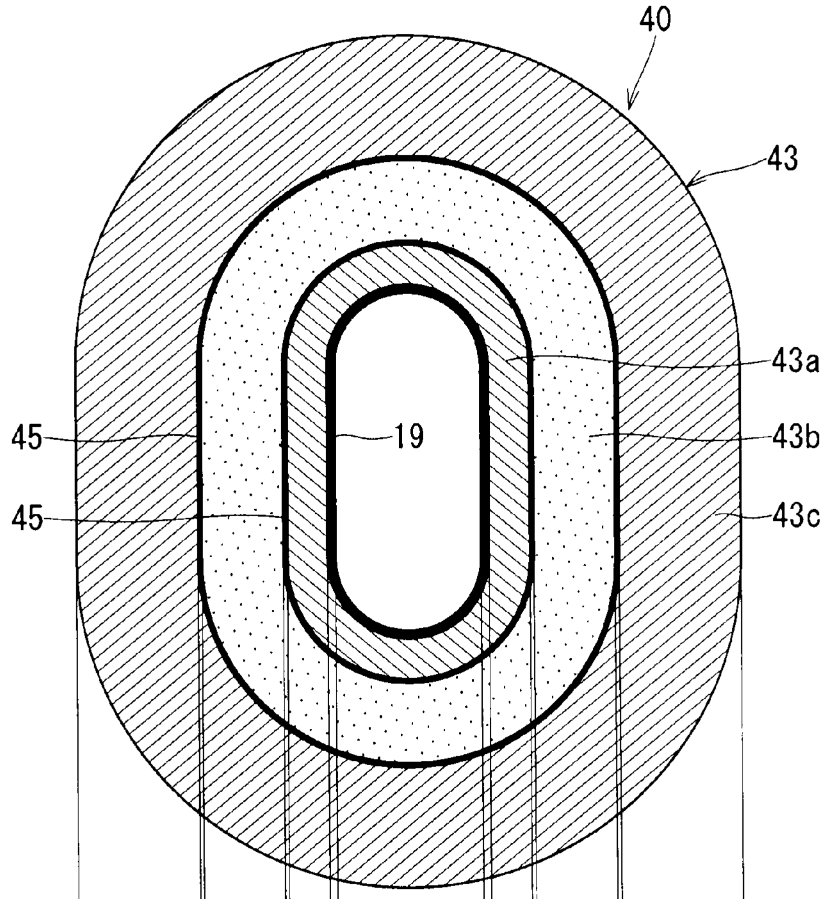
FIG. 10A is a plan view and FIG. 10B is a sectional view thereof.
Figure 10B:
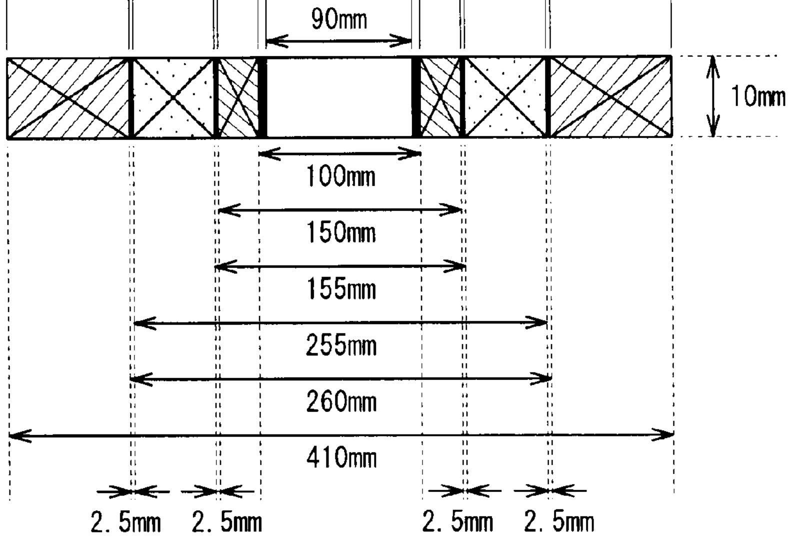

For example, as shown in FIGS. 10A and 10B, a superconducting coil 40 has an FRP core 19 having 100 mm in outside diameter and 90 mm in inside diameter and includes a linear portion having a length of 150 mm. A superconducting coil portion 43 is provided on an outer surface of the FRP core 19. The superconducting coil portion 43 is 410 mm in outside diameter and 100 mm in inside diameter and includes a linear portion having a length of 150 mm.

In this example, the superconducting coil 40 is formed by winding 750 turns of a composite tape 11. The superconducting coil portion 43 includes three identical coil layer portions coplanar with one another. The coil layer portions includes a coil inner layer portion (inner layer region, first layer region) 43*a* having an outside diameter of 150 mm and an inside diameter of 100 mm, a coil intermediate layer portion (intermediate layer region, second layer region) 43*b* having an outside diameter of 255 mm and an inside diameter of 155 mm, and a coil outer layer portion (outer layer region, third layer region) 43*c* having an outside diameter of 410 mm and an inside diameter of 260 mm.

Moreover, clearances 45 are provided, respectively, between the coil inner layer portion 43*a* and the coil intermediate layer portion 43*b* and between the coil intermediate layer portion 43*b* and the coil outer layer portion 43*c*.

In the structure of the fourth embodiment, the superconducting tape wires 1 on an outermost turn of the coil inner layer portion 43*a* and an innermost turn of the coil intermediate layer portion 43*b* are soldered to each other. The superconducting tape wires 1 on an outermost turn of the coil intermediate layer portion 43*b* and an innermost turn of the coil outer layer portion 43*c* are also soldered to each other. According to this soldered structure, the release portions having less adhesiveness than that of other portions are formed.

The superconducting coil 40 is formed by winding 750 turns of the composite tape 11 around the FRP core 19 having 90 mm in inside diameter and 100 mm in outside diameter and includes the linear portion having a length of 150 mm. The composite tape 11 is a laminate of the superconducting tape wire 1 having a width of 10 mm and a thickness of 0.1 mm and an insulating tape 8 coated with resin with a width of 10 mm and a thickness of 0.1 mm. A clearance of, for example, 2.5 mm is provided between an outer surface of the composite tape 11 at a 125th turn and an inner surface of the composite tape 11 at a 126th turn. Furthermore, a clearance of, for example, 2.5 mm is also provided on the outer surface of the composite tape 11 at a 375th turn and the inner surface of the composite tape 11 at a 376th turn.

The superconducting coil portion 43 of the superconducting coil 40 according to the present embodiment is divided into three coil layer portions including the coil inner layer portion 43*a*, the coil intermediate layer portion 43*b*, and the coil outer layer portion 43*c*. The diameter ratios of the coil layer portions 43 of the superconducting coil 40 are 150/100=1.5, 255/155=1.6, and 410/260=1.6, respectively. The coil portions of the superconducting coil 40 have diameter ratios of 1.5, 1.6, and 1.6, so that a maximum stress can be 10 MPa or less.

Accordingly, in the superconducting coil 40 of the present embodiment, since the diameter ratios can be less than 3.1, as shown in a graph of FIG. 5, a peel force generated on the superconducting tape wire 1 can be suppressed to less than an allowable value of 28 MPa.

Therefore, it is possible to prevent degradation of superconducting characteristics of the superconducting coil 40 and to improve the stability thereof.

Fifth Embodiment

A superconducting coil according to a fifth embodiment of the present invention will be described hereunder with reference to FIG. 11 (FIGS. 11A, 11B), in which the same configurations as in the fourth embodiment are indicated by the same reference numerals and the explanation thereof is omitted.

Figure 11A:
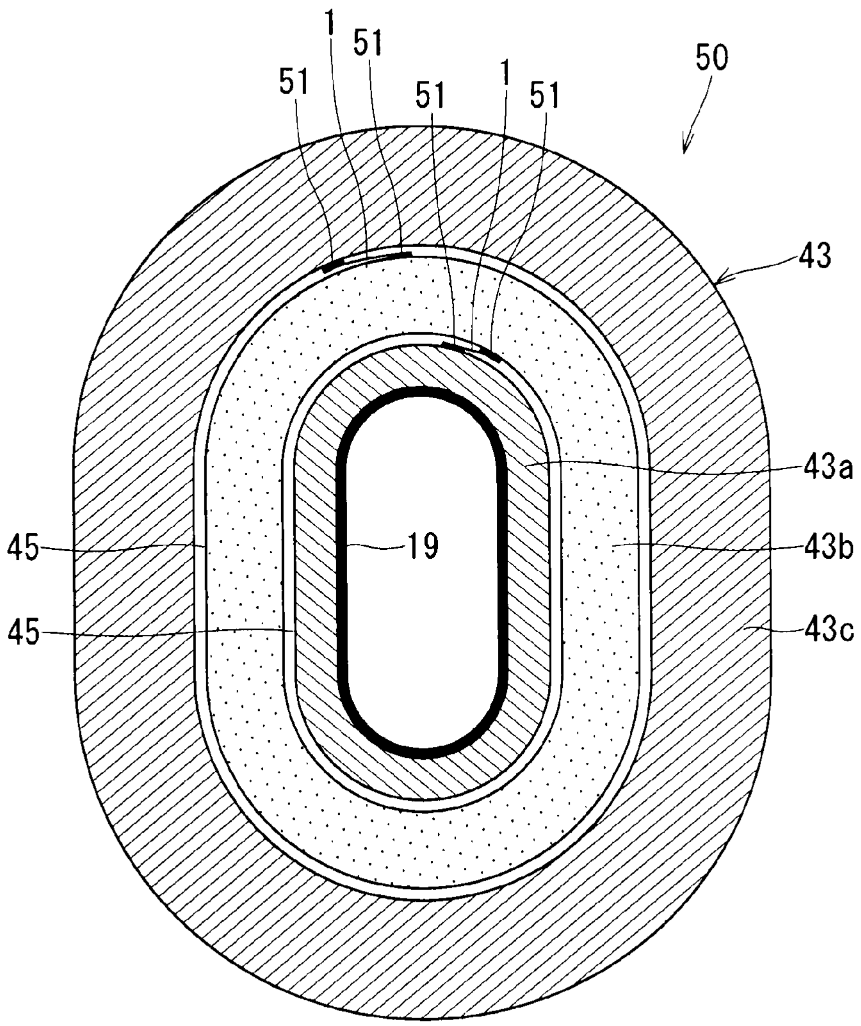
FIG. 11A is a plan view thereof and FIG. 11B is a partial sectional view thereof.
Figure 11B:
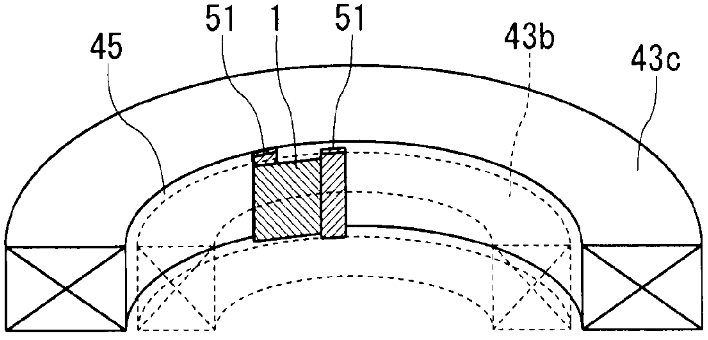

As illustrated in FIGS. 11A and 11B, a superconducting coil 50 of this fifth embodiment is identical to the superconducting coil 40 of the fourth embodiment except that copper electrodes 51 longer than a height of the superconducting coil 50 are soldered to an outermost turn of a coil inner layer portion (inner layer region, first layer region) 43*a*, innermost and outermost turns of a coil intermediate layer portion (intermediate layer region, second layer region) 43*b*, and an innermost turn of a coil outer layer portion (outer layer region, third layer region) 43*c* in a superconducting coil portion 43 and the adjacent copper electrodes 51 are soldered to each other via a superconducting tape wire 1.

In other words, the coil inner layer portion 43*a* and the coil intermediate layer portion 43*b* are electrically connected to each other via the copper electrode 51 and the superconducting tape wire 1, and the coil intermediate layer portion 43*b* and the coil outer layer portion 43*c* are electrically connected to each other via the copper electrode 51 and the superconducting tape wire 1.

In this fifth embodiment, the superconducting coil portion 43 is also divided into three coil layer portions including the coil inner layer portion 43*a*, the coil intermediate layer portion 43*b*, and the coil outer layer portion 43*c*. The diameter ratios of the coil layer portions of the superconducting coil 50 are 150/100=1.5, 255/155=1.6, and 410/260=1.6, respectively. Since the coil layer portions have diameter ratios of 1.5, 1.6, and 1.6, the maximum stress can be 10 MPa or less, thus reducing the peel force.

Therefore, in the superconducting coil 50 of the present embodiment, since the diameter ratios can be less than 3.1, as shown in a graph of FIG. 5, a peel force generated on the superconducting tape wire 1 can be suppressed to less than an allowable value of 28 MPa.

Accordingly, it is possible to prevent degradation of superconducting characteristics of the superconducting coil 50 and to thereby improve the stability thereof.

Sixth Embodiment

Figure 12:
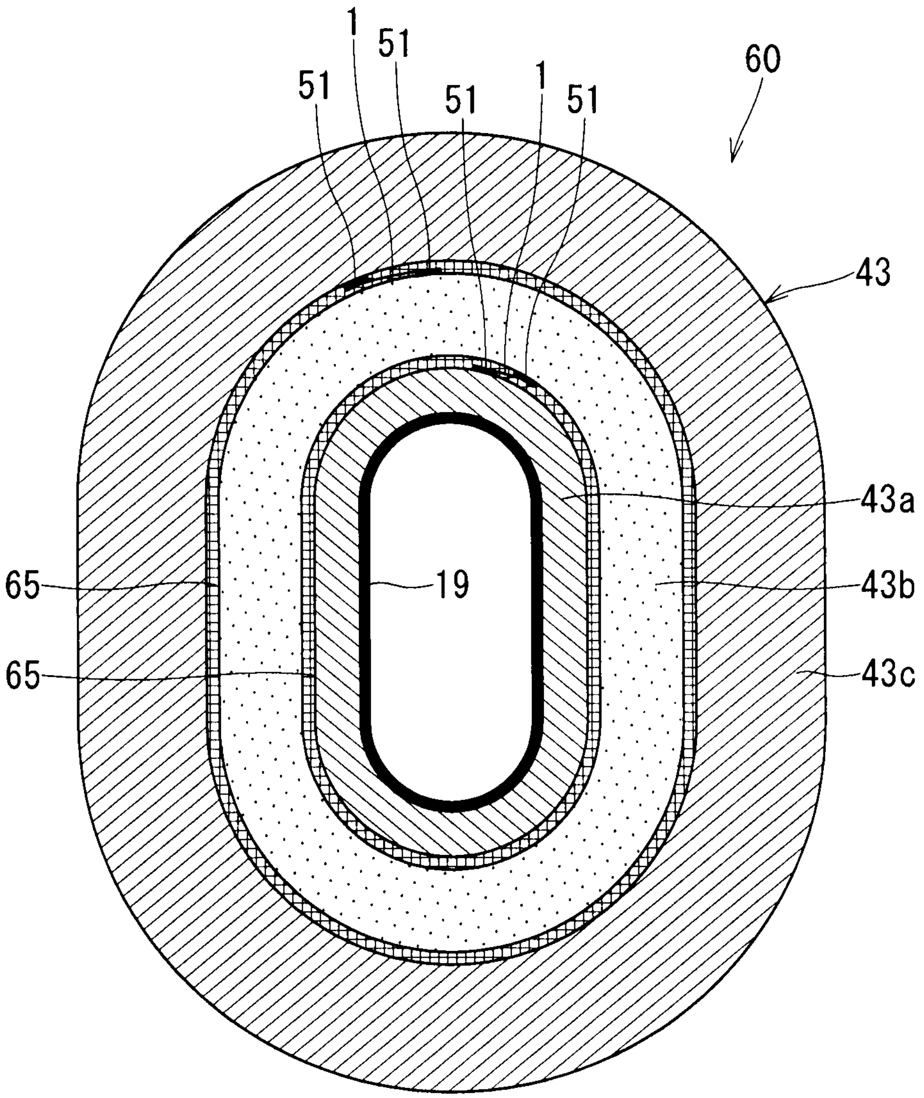
FIG. 12 illustrates a superconducting coil having non-circular shape in a plan view according to a sixth embodiment of the present invention.

A superconducting coil according to a sixth embodiment of the present invention will be described hereunder with reference to FIG. 12, in which the same configurations as in the fourth and fifth embodiments are indicated by the same reference numerals and the explanation thereof is omitted.

A superconducting coil 60 of this sixth embodiment is identical to the superconducting coil 50 of the fifth embodiment except that insulators 65, which are subjected to mold release treatment and are set to be non-adhesive or less adhesive than other portions, are inserted, respectively, between a coil inner layer portion (inner layer region, first layer region) 43*a* and a coil intermediate layer portion 43*b* and between the coil intermediate layer portion (intermediate layer region, second layer region) 43*b* and a coil outer layer portion (outer layer region, third layer region) 43*c*.

According to the sixth embodiment, in addition to the same effects as those attained by the superconducting coil 50 of the fifth embodiment, the superconducting coil 60 can attain effectively reducing clearances among the coil inner layer portion 43*a*, the coil intermediate layer portion 43*b*, and the coil outer layer portion 43*c*. Thus, a mechanical strength of the superconducting coil 60 can be increased by filling the clearances with the insulators 65.

Further, in addition to the above, Teflon (registered trademark) resins, polyimide/polyamide resins, or epoxy resins may be used as less adhesive materials for the insulators 65.

Seventh Embodiment

Figure 13:
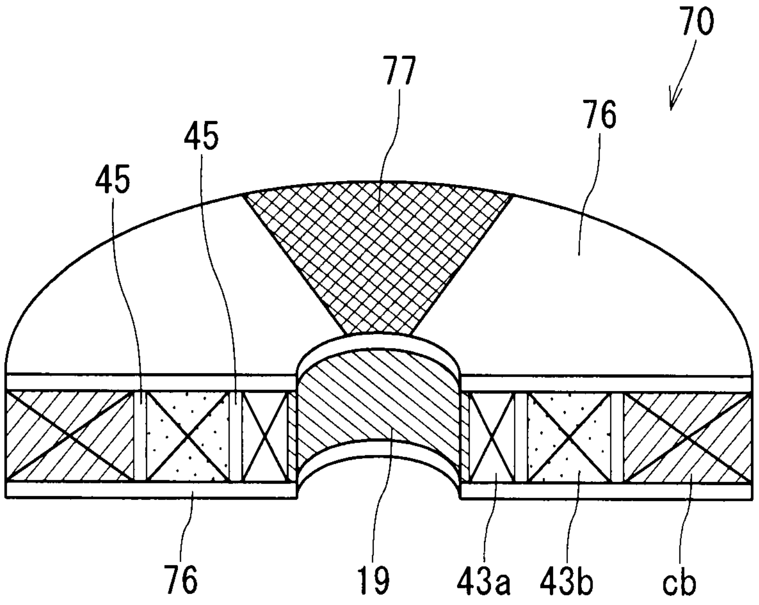
FIG. 13 is a partial sectional perspective view illustrating a superconducting coil having non-circular shape according to a seventh embodiment of the present invention.
Figure 14A:
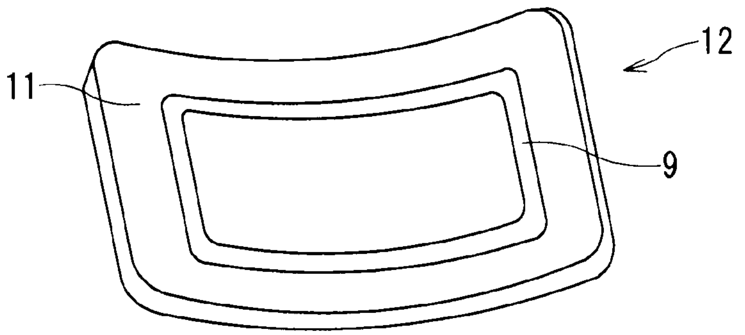
FIGS. 14A to 14D illustrates examples of modified embodiments of superconducting coils having non-circular shape according to the present invention corresponding to FIG. 4 showing various non-circular shape of the superconducting coil.
Figure 14B:
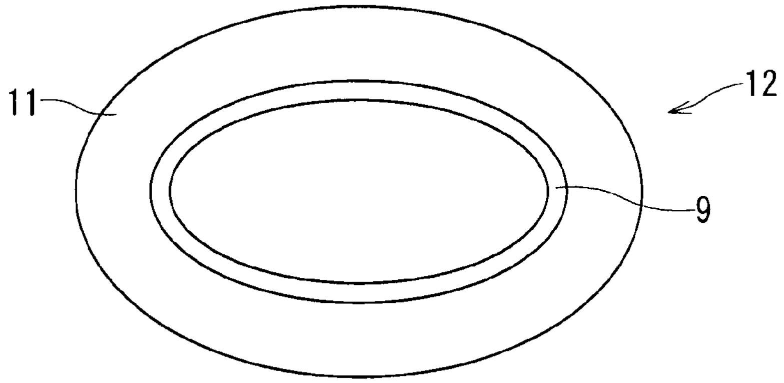
Figure 14C:
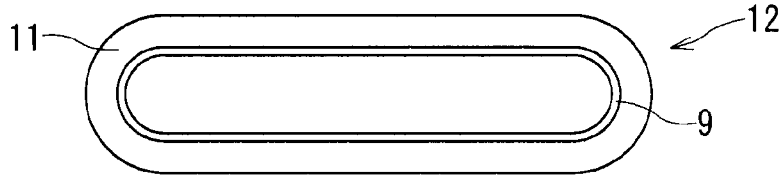
Figure 14D:
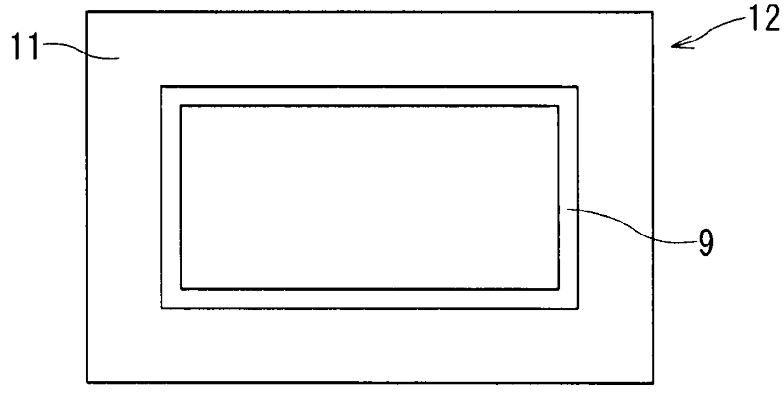

A superconducting coil according to a seventh embodiment of the present invention will be described hereunder with reference to FIG. 10 and FIG. 13, in which the same configurations as in the fourth to sixth embodiments are indicated by the same reference numerals and the explanation thereof is omitted.

A superconducting coil 70 of this seventh embodiment is identical to the superconducting coil 40 of the fourth embodiment except that a non-circular insulating plate 76 is attached to each surface of the superconducting coil 70 and a cooling plate 77 made of, for example, aluminum is attached to the insulating plate 76.

According to the superconducting coil 70 of the seventh embodiment, it is possible to prevent shrinkage of the superconducting coil 70 during cooling, thereby preventing displacements of a coil inner layer portion (inner layer region, first layer region) 43*a*, a coil intermediate layer portion (intermediate layer region, second layer region) 43*b*, and a coil outer layer portion (outer layer region, third layer region) 43*c*. Furthermore, the superconducting coil 70 can be cooled through the aluminum cooling plate 77.

Therefore, in addition to the same effect as that of the superconducting coil 40 of the fourth embodiment, it is possible to prevent a displacement of the superconducting coil 70. Moreover, the superconducting coil 70 of this embodiment can be cooled and, hence, be further stabilized.

Further, in the superconducting coils according to the respective embodiments of the present invention, the superconducting coil portion includes the three identical coil layer portions. The superconducting coil portion may include two identical coil layer portions, for example, a coil inner layer (inner layer region) and a coil outer layer (outer layer region).

Furthermore, it is to be noted that, in an alternation or modification, the superconducting coil portion of the superconducting coil may include at least four identical coil layer portions. A large number of coil layer portions are suitable for a large-sized superconducting coil.

In the structure in which the superconducting coil has a superconducting coil portion including at least four coil layer portions, at least two coil inner (intermediate) layer portions are provided between a coil outermost layer portion and a coil innermost layer portion.

By the structure in which the superconducting coil portion includes multiple coil layer portions, a reduced maximum stress can be obtained in the large superconducting coil by setting diameter ratios of the coil layer portions at 1.7 or less, for example, 1.2, 1.3, or 1.5. Thus, the degradation of a heat conduction property can be reliably prevented. Furthermore, thermal stability of the superconducting coil can be improved and maintained.

In this case, the diameter ratios of the coil layer portions of the superconducting coil portion are less than 3.1, and preferably, the diameter ratios are 1.7 or less. More preferably, the diameter ratios are 1.5 or less, for example, 1.2 or 1.3. In the case where the diameter ratios of the coil layer portions in the superconducting coil portion are not larger than 1.7 or 1.5, each of the coil layer portions of the superconducting coil can have a maximum stress of 10 MPa or less or about 5 MPa or less. Thus, the peel force generated in the superconducting coil can be reduced to prevent the degradation of superconducting characteristics of the superconducting coil, thereby improving thermal stability of the superconducting coil.

According to the superconducting coil of the present embodiments, the single superconducting coil portion is divided into multiple coil layer portions and less adhesive boundary portions are provided between the coil layer portions, so that the boundary portions absorb a force so as to prevent transmission of the force.

The superconducting coil of the present embodiments each includes a composite tape 11 that is a laminate of a superconducting tape wire 1 and an insulating tape 8. The number of turns of the composite tape 11 is optionally selected from several tens to several thousands, and a width and a thickness of the superconducting tape wire 1 are also selected from 3 mm to 40 mm and from 0.04 mm to 0.5 mm. Moreover, a width and a thickness of the insulating tape 8 are selected as in the superconducting tape wire 1.

It is to be further noted that the present invention is not limited to the described and illustrated embodiments, and many other alternations and modifications may be made without departing from the scopes of the appended claims.

For example, although in the above described embodiments, the superconducting coil having a racetrack shape (non-circular shape) is typically mentioned, a saddle shape, an ellipse shape, an oval shape, and a rectangle shape and etc. having non-circular but concentric shape may be adopted such as shown in FIGS. 14A to 14D so as to reduce a peel force in the superconducting coil with higher stability. In these modified embodiments, only the shapes similar to that of FIG. 4, with the same reference numerals, are illustrated, but the details in functions and winding configuration are substantially the same as those of the described embodiments, and therefore, duplicated explanation is omitted herein.

Figure 15A:
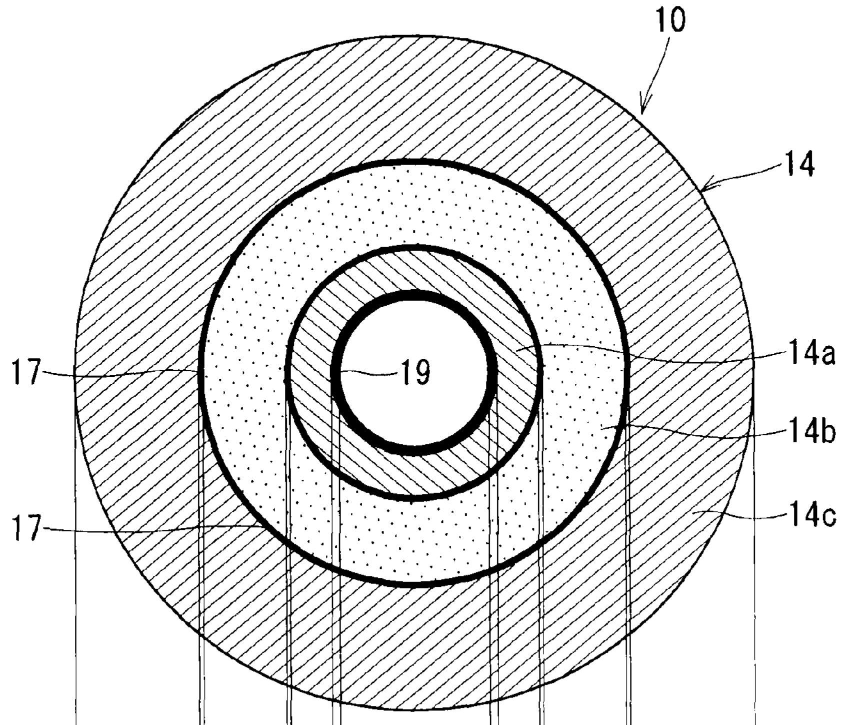
FIG. 15A is a plan view and FIG. 15B is a sectional view thereof.
Figure 15B:
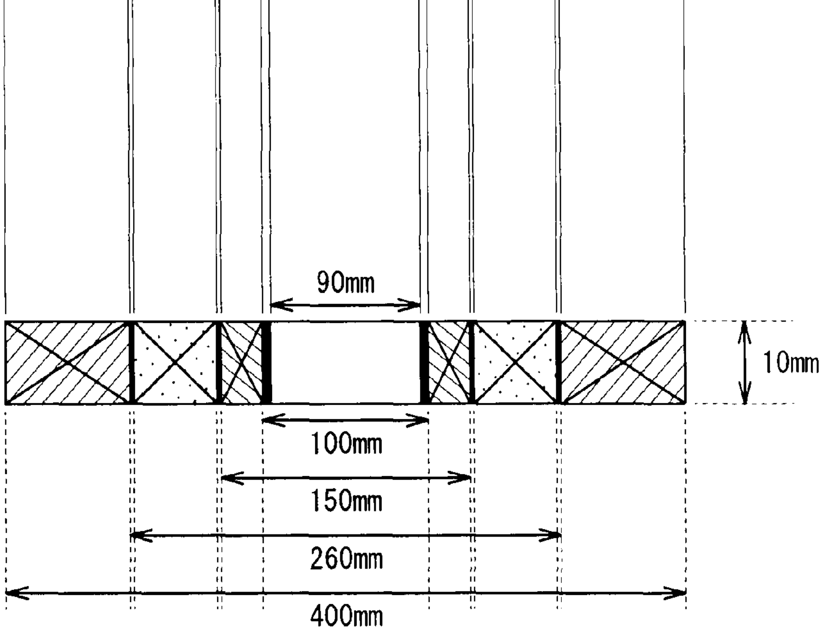

It is also to be noted that, as shown in FIG. 15, the superconducting coil according to the present invention includes a further embodiment, which is provided with a plurality of superconducting coil layer portions having a circular concentric shape. Although details are not described herein, according to such circular shaped superconducting coil, substantially the same functions and effects as those attained by the first embodiment shown in FIG. 6 (FIGS. 6A and 6B) mentioned above with respect to the superconducting coil having non-circular shape may be achieved. It is also noted that other examples of the concentric circular shape of the superconducting coil may attain functions and effects similar to those attained by the above second to seventh embodiments of the superconducting coils having the non-circular, but concentric shape.

What is claimed is:

1. A superconducting coil comprising a superconducting coil portion having a plurality of concentric coil layer portions, the superconducting coil portion being formed by winding a thin-film superconducting wire and an insulating material with a multilayer structure, wherein the concentric coil layer portions are adjacent to each other at boundary portions having adhesive forces that are set to be less than that of other portions and each of the plurality of coil layer portions has a diameter ratio of less than 3.1.

2. The superconducting coil according to claim 1, wherein the superconducting wire and the insulating material are contacted in non-bonded condition to each other at the boundary portion between the adjacent concentric coil layer portions.

3. The superconducting coil according to claim 1, wherein a release agent is disposed on at least one of the superconducting wire and the insulating material at the boundary portion between the adjacent concentric coil layer portions.

4. The superconducting coil according to claim 1, further comprising an insulator inserted in the boundary portion between the adjacent concentric coil layer portions.

5. The superconducting coil according to claim 4, wherein the insulator is formed of an insulator bonded or applied with at least one release agent selected from the group consisting of fluorocarbon tape, paraffin, grease, and silicon oil.

6. The superconducting coil according to claim 1, further comprising a cooling member at the boundary portion disposed between the adjacent concentric coil layer portions.

7. The superconducting coil according to claim 6, wherein the cooling member is a cooling plate made of a material having a heat conductivity higher than that of the insulating material.

8. The superconducting coil according to claim 6, wherein the cooling member comprises an insulating material disposed on a cooling plate.

9. The superconducting coil according to claim 1, wherein the adjacent concentric coil layer portions are electrically connected to each other.

10. The superconducting coil according to claim 9, further comprising electrodes disposed on an outer surface of an inner layer portion and an inner surface of an outer layer portion at the boundary portion between the adjacent concentric coil layer portions, the electrodes being electrically connected to each other.

11. The superconducting coil according to claim 1, further comprising an insulator disposed on at least one of an upper surface and a lower surface of the superconducting coil portion.

12. The superconducting coil according to claim 11, further comprising a cooling plate attached to the insulator, the cooling plate being made of a material having a heat conductivity higher than that of the insulator.

13. The superconducting coil according to claim 1, wherein the concentric coil layer portions each has a non-circular shape.

14. The superconducting coil according to claim 1, wherein the concentric coil layer portions each has a circular shape.

* * * * *